(12) United States Patent
Kim et al.

(10) Patent No.: US 8,610,850 B2
(45) Date of Patent: Dec. 17, 2013

(54) DISPLAY DEVICE

(75) Inventors: Sung-Gyu Kim, Yongin (KR); Jae-Mo Chung, Yongin (KR); Hyung-Wook Kim, Yongin (KR); Sung-Gon Seo, Yongin (KR); Jong-Kwang Hwang, Yongin (KR)

(73) Assignee: Samsung Display Co., Ltd. (KR)

( * ) Notice: Subject to any disclaimer, the term of this patent is extended or adjusted under 35 U.S.C. 154(b) by 303 days.

(21) Appl. No.: 13/025,097

(22) Filed: Feb. 10, 2011

(65) Prior Publication Data

US 2011/0242467 A1 Oct. 6, 2011

(30) Foreign Application Priority Data

Apr. 5, 2010 (KR) .................. 10-2010-0030983

(51) Int. Cl.
*G02F 1/1335* (2006.01)
(52) U.S. Cl.
USPC .......................................................... 349/113
(58) Field of Classification Search
USPC .......................................................... 349/113
See application file for complete search history.

(56) References Cited

U.S. PATENT DOCUMENTS

| 7,199,855 B2* | 4/2007 | Yoshimi et al. ............... 349/187 |
| 7,485,350 B2* | 2/2009 | Pang et al. ..................... 428/1.1 |
| 2001/0022632 A1* | 9/2001 | Umemoto et al. ............. 349/12 |
| 2002/0080308 A1* | 6/2002 | Umemoto et al. ............. 349/96 |
| 2004/0140516 A1* | 7/2004 | Yoshikawa et al. ........... 257/437 |
| 2007/0190296 A1* | 8/2007 | Yoshikawa et al. ........ 428/195.1 |
| 2010/0149136 A1* | 6/2010 | Fukushima et al. .......... 345/204 |

FOREIGN PATENT DOCUMENTS

| JP | 2003-280013 A | 10/2003 |
| JP | 2004-119087 A | 4/2004 |
| KR | 1020020007130 A | 1/2002 |
| KR | 1020080029069 | 4/2008 |
| KR | 1020080029069 A | 4/2008 |

* cited by examiner

*Primary Examiner* — Kaveh Kianni
(74) *Attorney, Agent, or Firm* — Knobbe Martens Olson & Bear LLP

(57) ABSTRACT

A display device is disclosed. The display device includes: a display panel including a display surface and a peripheral area surrounding the display surface, a transparent plate covering the display surface and the peripheral area, a resin layer disposed between the display panel and the transparent plate, and hardened by light, and a reflective layer provided between the transparent plate and the resin layer, along the peripheral area of the display panel.

18 Claims, 6 Drawing Sheets

DISPLAY DEVICE

CROSS-REFERENCE TO RELATED APPLICATIONS

This application claims priority to and the benefit of Korean Patent Application No. 10-2010-0030983 filed in the Korean Intellectual Property Office on Apr. 5, 2010, the entire contents of which are incorporated herein by reference.

BACKGROUND

1. Field

The disclosure relates generally to a display device including a transparent plate.

2. Description of the Related Technology

A display device displays an image, and may be classified as a liquid crystal display device, a plasma display panel, or an organic light emitting diode (OLED) display according to the type of a display panel included in the display device.

A display device generally has a transparent plate on a display panel placed in a receiving member to prevent interference to the display panel, and a resin layer is generally disposed between the display panel and the transparent plate to attach the display panel and the transparent plate to each other.

In such devices, the resin layer is disposed between the display panel and the transparent plate to attach the display panel and the transparent plate to each other, and ultraviolet (UV) is irradiated to the resin layer through the transparent plate or irradiated between the display panel and the transparent plate from a side of the display device to harden the resin layer disposed between the display panel and the transparent plate.

However, when disposing the resin layer between the display panel and the transparent plate, the resin layer is also disposed between the display panel and the receiving member. A black matrix is typically disposed in the transparent plate between the display panel and the receiving member. The black matrix prevents the display panel and the transparent plate from being viewed from the outside. The UV passed through the transparent plate for hardening the resin layer and the UV irradiated between the display panel and the transparent plate from the side of the display panel are irradiated only to the resin layer disposed between the display panel and the transparent plate. Accordingly the resin layer disposed between the display panel and the receiving member is not fully hardened because the UV is not irradiated thereto.

The information disclosed in this section is only for enhancement of understanding of the background of the described technology.

SUMMARY OF CERTAIN INVENTIVE ASPECTS

The described technology has been made in an effort to provide a display device having a fully hardened resin layer disposed between a display panel and a transparent plate and a fully hardened resin layer disposed between a receiving member and the display panel.

One aspect is a display device including: a display panel including a display surface and a peripheral area surrounding the display surface, a transparent plate covering the display surface and the peripheral area, a resin layer disposed between the display panel and the transparent plate, and hardened by light, and a reflective layer provided between the transparent plate and the resin layer, along the peripheral area of the display panel.

The resin layer along the peripheral area may be configured to be hardened by the light reflected by the reflective layer.

The display panel may further include a second reflective layer along the peripheral area, with the resin layer interposed between the reflective layer and the second reflective layer.

The resin layer along the peripheral area may be configured to be hardened by the light reflected between the reflective layer and the second reflective layer.

The transparent plate may further include a black matrix layer covered by the reflective layer.

The display device may further include a receiving member receiving the display panel, where the receiving member includes a bottom portion facing the display panel and a sidewall extending upward from the bottom portion and facing an edge of the display panel, and where the resin layer is disposed between the edge of the display panel and the sidewall.

The reflective layer may be wider than the second reflective layer, and the reflective layer may be disposed on the resin layer disposed between the edge of the display panel and the sidewall.

The resin layer disposed between the edge of the display panel and the sidewall may be configured to be hardened by the light reflected by the reflective layer.

The display panel may include liquid crystal or an organic light emitting element.

The light may have a wavelength in the ultraviolet range.

The reflective layer may be configured to reflect light beams incident to the reflective layer to an area between the sidewall and the edge of the display panel substantially filled with resin.

Another aspect is a display device including: a display panel including a display surface and a peripheral area surrounding the display surface, a transparent plate covering the display surface and the peripheral area, a resin layer disposed between the display panel and the transparent plate, and hardened by light, a first reflective layer provided between the transparent plate and the resin layer, along the peripheral area of the display panel, a second reflective layer along the peripheral area of the display panel, with the resin layer interposed between the reflective layer and the second reflective layer.

The resin layer may be configured to be hardened by the light reflected between the reflective layer and the second reflective layer.

The transparent plate may further include a black matrix layer covered by the reflective layer.

The display device may further include a receiving member receiving the display panel, where the receiving member includes a bottom portion facing the display panel and a sidewall extending upward from the bottom portion and facing an edge of the display panel, and where the resin layer is disposed between the edge of the display panel and the sidewall.

The reflective layer may be wider than the second reflective layer, and the reflective layer is disposed on the resin layer disposed between the edge of the display panel and the sidewall.

The resin layer disposed between the edge of the display panel and the sidewall may be configured to be hardened by the light reflected by the reflective layer.

The display panel may include liquid crystal or an organic light emitting element.

The light may have a wavelength in the ultraviolet range.

The reflective layer and the second reflective layer may be configured to reflect light beams incident to the reflective layer and the second reflective layer to an area between the sidewall and the edge of the display panel substantially filled with resin.

DETAILED DESCRIPTION OF CERTAIN INVENTIVE EMBODIMENTS

Figure 1:
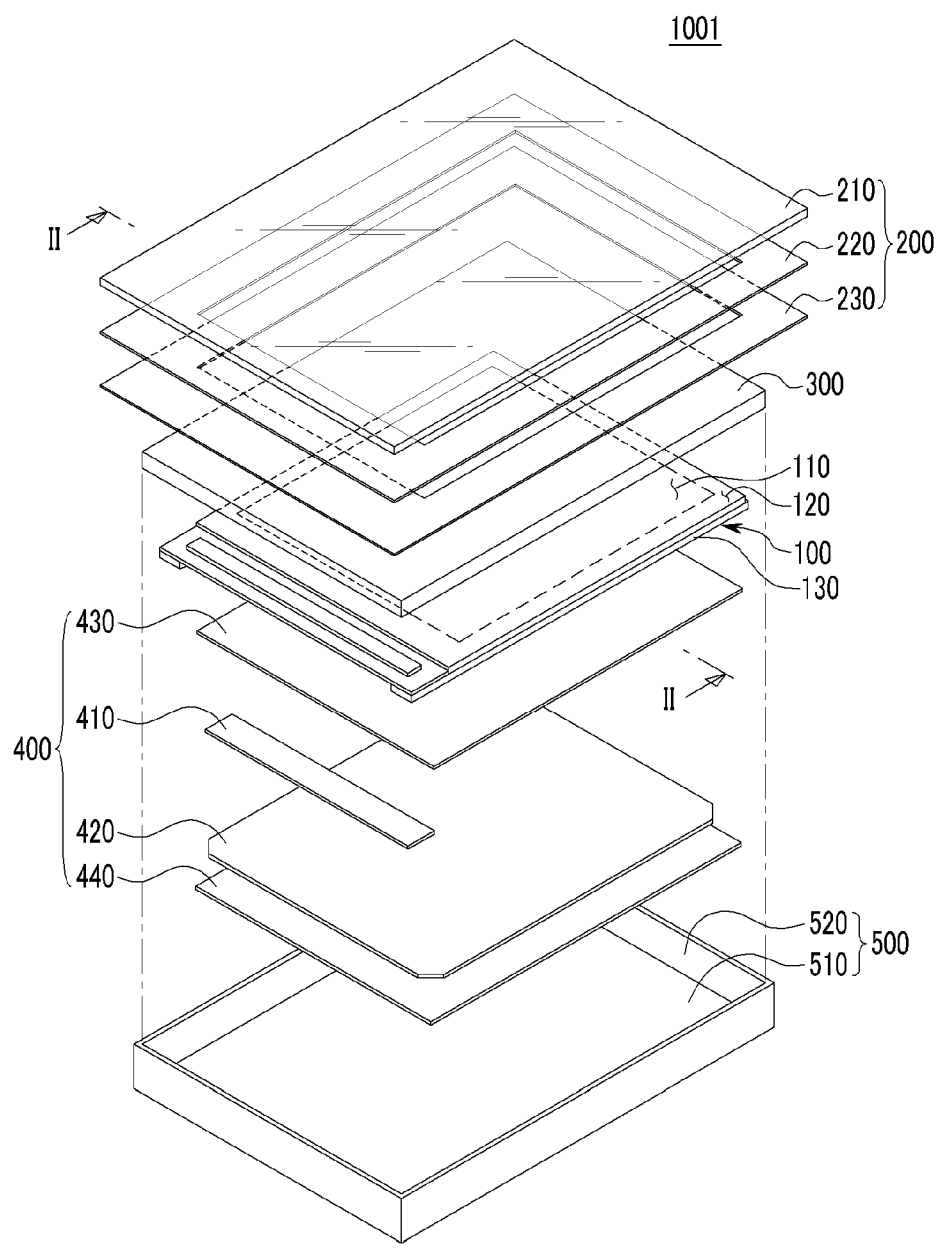
FIG. 1 is a perspective view of an embodiment of a display device.

Embodiments of the present invention will be described more fully hereinafter with reference to the accompanying drawings, in which exemplary embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the disclosure.

Constituent elements having the same structures throughout the embodiments are generally denoted by the same reference numerals and are described in a first exemplary embodiment. In the subsequent exemplary embodiments, such description is not repeated.

In the drawings, the sizes and thicknesses of the components are merely shown for convenience of explanation, and therefore embodiments are not necessarily limited to the illustrations described and shown herein.

In the drawings, the thicknesses of layers, films, panels, regions, and the like, are exaggerated for clarity. In the drawings, the thicknesses of some layers and areas are exaggerated for convenience of explanation. When it is described that one element such as a layer, a film, an area, a plate, and the like is formed on another element, it means that one element exists right on another element or that one element exists on another element with a further element therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Hereinafter, a display device 1001 according to a first exemplary embodiment will be described with reference to FIG. 1 and FIG. 2. The display device 1001 of the first exemplary embodiment is exemplarily described as a liquid crystal display (LCD), but a display device according to another exemplary embodiment may be an organic light emitting diode (OLED) display having a transparent plate, or a plasma display panel.

FIG. 1 is an exploded perspective view of an embodiment of a display device. FIG. 2 is a cross-sectional view of FIG. 1, taken along line II-II.

Figure 2:
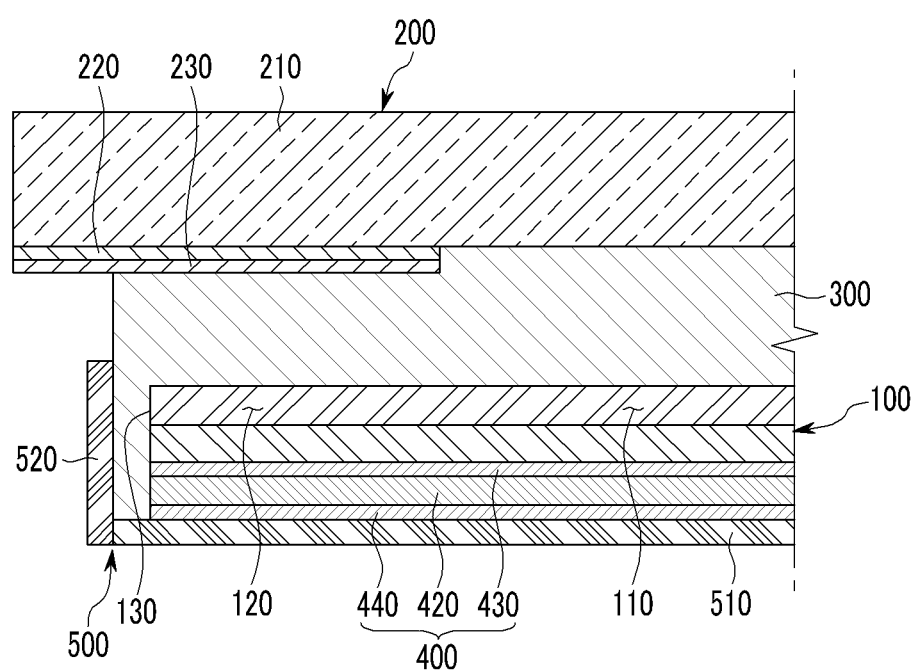
FIG. 2 is a cross-sectional view of FIG. 1, taken along line II-II.

As shown in FIG. 1 and FIG. 2, the display device 1001 according to a first exemplary embodiment includes a display panel 100, a transparent plate 200, a resin layer 300, a backlight unit 400, and a receiving member 500.

The display panel 100 includes liquid crystal, and displays an image using light irradiated from the backlight unit 400. The display panel 100 includes substrates facing each other, and liquid crystal is disposed between the facing substrates. Wires are formed in at least one of the facing substrates and the liquid crystal moves by a magnetic field generated by the wires such that an image is displayed on the display panel 100 by controlling the amount of light irradiated to the display panel 100 to the backlight unit 400. A polarizing plate that changes a polarization axis of the light irradiated to the display panel 100, or passed through the display panel 100 and then emitted to the outside, may be attached to a front side or a rear side of the display panel 100. The display panel 100 includes a display area 110 for displaying an image and a peripheral area 120 neighboring the display area 110. In one embodiment, the peripheral area 120 of the display panel 100 surrounds the display area 110.

The transparent plate 200 is disposed on the display panel 100, with the resin layer 300 interposed therebetween.

The transparent plate 200 includes a transparent plate main body 210 facing the display panel 100, a black matrix layer 220, and a first reflective layer 230.

The transparent plate main body 210 may be made of a transparent material such as glass, resin, or the like, and protects the display panel 100 from external impact. The transparent plate main body 210 faces the display panel 100 on the display panel 100, and covers the display area 110 and the peripheral area 120 of the display panel 100. The transparent plate main body 210 is attached to the display panel 100 by the resin layer 300 disposed between the display panel 100 and the transparent plate 200, and improves impact resistance of the display device 1001 by protecting the display panel 100 along with the resin layer 300. In one embodiment, the transparent plate main body 210 is larger than the display panel 100. In other embodiments, the transparent plate 200 may be substantially equivalent to the display panel 100 in size.

The black matrix layer 220 is covered by the first reflective layer 230 corresponding thereto, and faces the resin layer 300 interposed by the first reflective layer 230. The black matrix layer 220 may be formed in a shape corresponding to the peripheral area 120 of the display panel 100, and may prevent the peripheral area 120 and a receiving member 500 of the display panel 100 to be viewed from the outside. The black matrix layer 220 includes a light absorbing material such as chromium (Cr), for example.

The first reflective layer 230 may be disposed between the black matrix layer 220 and the resin layer 300, and may be formed in a shape corresponding to the peripheral area 120 of the display panel 100. In some embodiments, the first reflective layer 230 may be formed in a shape that is substantially equivalent to the black matrix layer 220, and the first reflective layer 230 and the black matrix layer 220 may be integrally formed. The first reflective layer 230 faces the resin layer 300, and may include a metal having high reflectivity such as aluminum (Al), for example. The first reflective layer 230 may also include various light-reflective metals such as silver (Ag), iron (Fe), and the like, and may also include various organic or inorganic material of which the surface is processed to be high reflective.

The first reflective layer 230 reflects the light irradiated thereto to a direction of the resin layer 300, and the resin layer 300 that faces the first reflective layer and corresponds to the peripheral area 120 of the display panel 100 is hardened by the light reflected by the first reflective layer 230. The first reflective layer 230 is disposed on the resin layer 300 that is disposed between the display panel 100 and the receiving member 500, and accordingly, the resin layer 300 is hardened by the light reflected by the first reflective layer 230. Hardening of the resin layer 300 facing the first reflective layer 230 is described below.

The resin layer 300 surrounds the display panel, and is located between the display panel 100 and the transparent plate 200, and between display panel 100 and the receiving member 500. The resin layer 300 surrounds the display panel 100 so that an air gap is not formed between the display panel 100 and the transparent plate 200 and between the display panel 100 and the receiving member 500, and so that a foreign particle like dust cannot be inserted between the display panel 100 and the transparent plate 200 and between the display panel 100 and the receiving member 500. Accordingly, distortion of an image displayed on the display panel 100 due to an air gap or foreign particle can be prevented.

The resin layer 300 also attaches the transparent plate 200 to the display panel 100 to protect the display panel 100 and the transparent plate 200 and to improve impact resistance of the display device 1001. The resin layer 300 is hardened with light having a UV wavelength by including a UV hardened resin, and the resin layer 300 disposed between the display panel 100 and the receiving member 500 is hardened with light reflected by the first reflective layer 230. The hardening of the resin layer 300 disposed between the display panel 100 and the receiving member 500 with the light reflected by the first reflective layer 230 is described below.

The backlight unit 400 irradiates light to the display panel 100, and includes a light emitting unit 410, a light guiding plate 420, an optical sheet 430, and a reflective sheet 440.

The light emitting unit 410 generates light, and is located along the edge of the light guiding plate 420. The light generated from the light emitting unit 410 is irradiated to the light guiding plate 420, and the light emitted to the light guiding plate 420 is irradiated to a direction of the display panel 100 by the light guiding plate 420. The light emitting unit 410 may be a dot light source, a linear light source, or the like. The light irradiated from the light emitting unit 410 is converted into a surface light source and then irradiated to a direction of the display panel 100.

The light guiding plate 420 is disposed between the optical sheet 430 and the reflective sheet 440, and converts the light irradiated from light emitting unit 410 to a surface light source and irradiates the converted light to the display panel 100.

The optical sheet 430 deforms the light irradiated from the light guiding plate 420 to improve the display quality of an image realized by the display panel 100. The optical sheet 430 may include a diffusion sheet, a prism sheet, and a protection sheet.

The reflective sheet 440 is disposed between the light guiding plate 420 and the receiving member 500, and reflects the light passed through the light guiding plate 420 and irradiated to the reflective sheet 440 back to the light guiding plate 420 so as to reflect light emitted from the light emitting unit 410 and passed through the light guiding plate 420, to the display panel 100.

One embodiment of the display device 1001 may further include a mould frame supporting the backlight unit 400. The display panel 100, the backlight unit 400, and the mould frame may be received in the receiving member 500.

The receiving member 500 receives the display panel 100 and the backlight unit 400, and may be formed with a material that is stronger than the transparent plate 200. In some embodiments, the receiving member 500 may be made of a metal such as stainless steel, cold-rolled steel plate, an aluminum-nickel-silver alloy, or the like.

A bottom portion 510 may have a plate shape, may face the display panel 100, and the backlight unit 400 disposed on the bottom portion 510 may be interposed therebetween. A barrier rib (or a sidewall) 520 is bent to extend upwards from the bottom portion 510.

The barrier rib (or sidewall) 520 is bent to extend from the bottom portion 510 and faces an edge 130 of the display panel 100, with the resin layer 300 interposed therebetween. The resin layer 300 is disposed between the barrier rib 520 and the display panel 100. The resin layer supports the display panel 100 with respect to the receiving member 500. In addition, wires formed in the display panel 100 and the barrier rib 520 can be prevented from being short-circuited by interposing the resin layer 300 between the barrier rib 520 and the display panel 100.

Hereinafter, hardening of the resin layer 300 by light will be described in further detail with reference to FIG. 3.

Figure 3:
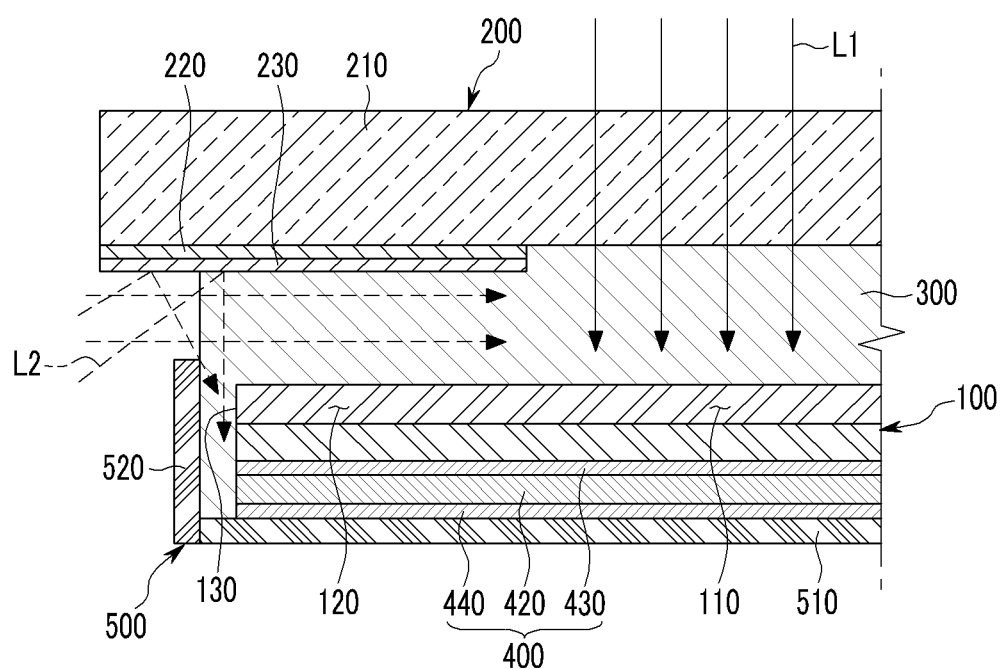
FIG. 3 is a cross-sectional view of a path of light for hardening a resin layer of the embodiment of a display device of FIG. 2.

FIG. 3 is a cross-sectional view of a path of light for hardening the resin layer of the embodiment of the display device of FIG. 2.

As shown in FIG. 3, an embodiment of the display device 1001 irradiates a first light L1, having a UV wavelength, through the transparent plate 200 of the display device 1001 to the resin layer 300 disposed between the transparent plate 200 and the display panel 100 to fully harden the resin layer 300 disposed between the transparent plate 200 and the display panel 100. In The first light L1 is blocked by the black matrix layer 220 corresponding to the peripheral area 120 of the display panel 100 so that only the resin layer 300 corresponding to the display area 110 of the display panel 100 is fully hardened.

In order to fully harden the resin layer 300 corresponding to the peripheral area 120 of the display panel 100, a second light L2 having a UV wavelength is irradiated between the display panel 100 and the transparent plate 200 from a side of the display device 1001. The second light L2 is reflected by the first reflective layer 230 so that the resin layer 300 corresponding to the peripheral area 120 of the display panel 100 is fully hardened. The second light L2 is reflected by the first reflective layer 230 and irradiated between the edge 130 of the display panel 100 and the barrier rib (or sidewall) 520 of the receiving member 500, and the resin layer 300 disposed between the edge 130 of the display panel 100 and the barrier rib 520 of the receiving member 500 is fully hardened by the light reflected by the first reflective layer 230 and irradiated between the edge 130 of the display panel 100 and the barrier rib 520 of the receiving member 500.

In an embodiment of the display device 1001, all the resin layers 300 surrounding the display panel 100 are fully hardened so that adhesiveness of the transparent plate 200 to the display panel 100 is enhanced and the adhesiveness of the display panel 100 to the receiving member 500 is also enhanced. Accordingly, impact resistance of the display device 1001 is enhanced.

Since all the resin layers 300 surrounding the display panel 100 are fully hardened in the display device 1001, occurrence of image distortion caused by stains or spots formed in the resin layer 300 may be prevented.

In one embodiment of the display device 1001, the resin layer 300 surrounds the display panel 100 so that generation of air gaps between the display panel 100 and the transparent plate 200 and between the display panel 100 and the receiving member 500 can be prevented. Insertion of foreign particles between the display panel 100 and the transparent plate 200 and between the display panel 100 and the receiving member 500 may also be prevented. Accordingly, the image displayed on the display panel 100 is prevented from being distorted due to an air gap or a foreign particle.

In one embodiment of the display device 1001, the resin layer 300 is hardened while the display panel 100 is in the receiving member 500, such that it is not necessary to harden the resin layer 300 before the display panel 100 is in the receiving member 500, and accordingly convenience of the process is enhanced. In order to harden the resin layer 300 before the display panel 100 is received in the receiving member 500, an additional process is generally performed to mechanically cut or add the resin layer 300 to fit it into the receiving space of the receiving member 500.

Hereinafter, another embodiment of a display device 1002 will be described with reference to FIG. 4 and FIG. 5. The embodiment of the display device 1002 will be exemplarily described as an OLED display.

Figure 4:
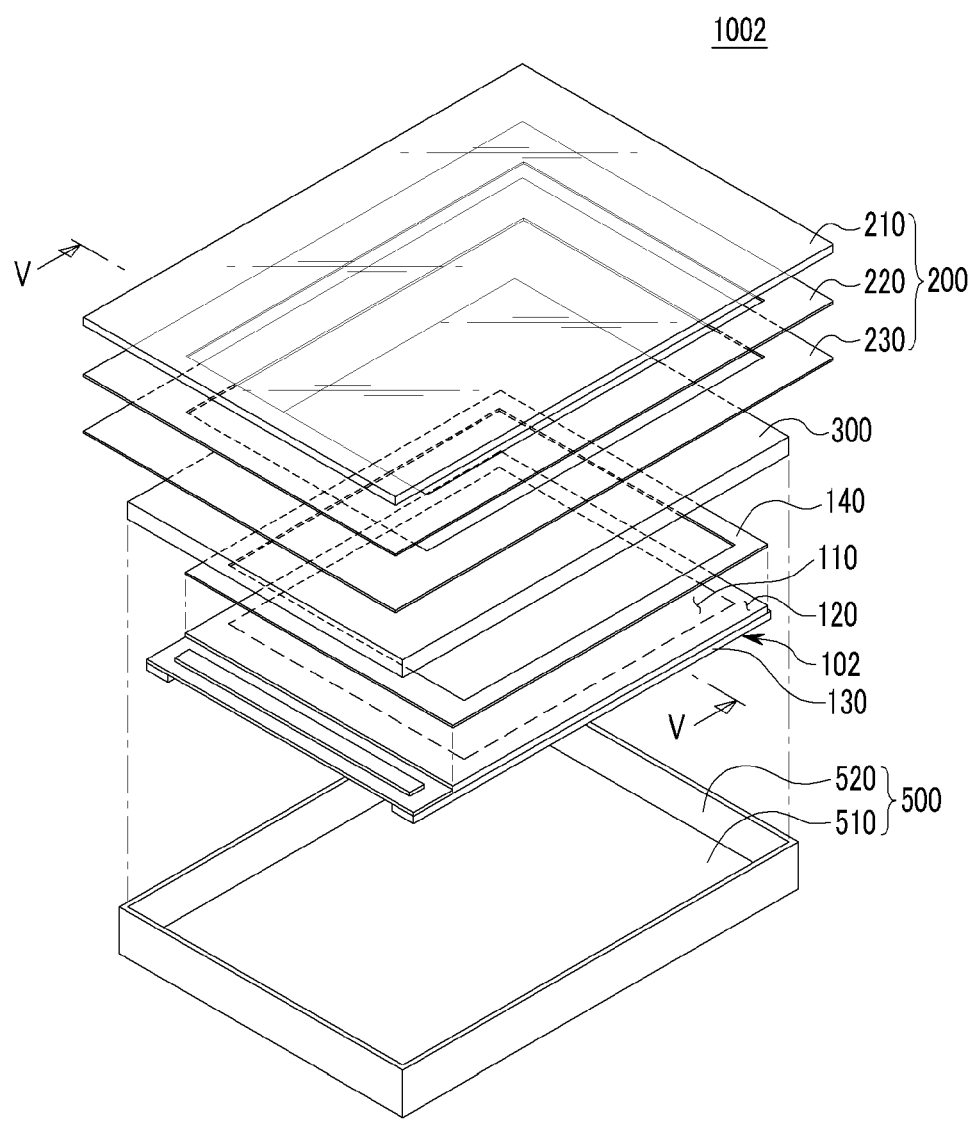
FIG. 4 is a perspective view of another embodiment of a display device.

FIG. 4 is a perspective view of another embodiment of the display device. FIG. 5 is a cross-sectional view taken along line V-V of FIG. 4.

Figure 5:
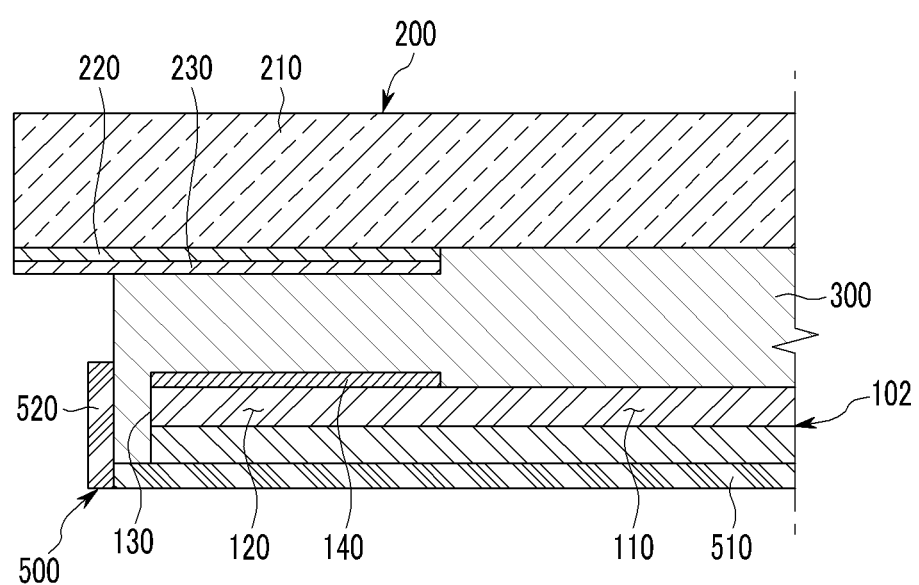
FIG. 5 is a cross-sectional view of FIG. 4, taken along line V-V.

As shown in FIG. 4 and FIG. 5, the embodiment of the display device 1002 includes a display panel 102, transparent plate 200, a resin layer 300, and a receiving member 500.

The display panel 102 includes an organic light emitting element, and displays an image using a self-light emission capability of the organic light emitting element. The display panel 102 includes substrates facing each other, and the organic light emitting element is interposed between the facing substrates. Wires are formed in at least one of the facing substrates, and the organic light emitting element emits light such that an image is displayed on the display panel 102.

A polarizing plate that converts a polarization axis of light irradiated from the display panel 102 may be attached to a front side of the display panel 102. In some embodiments, the display panel 102 includes a display area 110 displaying an image and a peripheral area 120 surrounding the display area 110.

The display panel 102 includes a second reflective layer 140 that corresponds to the peripheral area 120 and faces the first reflective layer 230 with a resin layer 300 interposed therebetween.

The second reflective layer 140 faces the first reflective layer 230, and has a shape that corresponds to the peripheral area 120 of the display panel 102. In some embodiments, the second reflective layer 140 may include a metal having high reflectivity, such as aluminum (Al), or the like. In other embodiments, the second reflective layer 140 may include various metals that can reflect light, such as silver (Ag), iron (Fe), and the like, and may include an organic or inorganic material of which a surface is processed to be high reflective. The second reflective layer 140 reflects light irradiated to the second reflective layer 140 to a direction of the resin layer 300, and the resin layer 300 facing the second reflective layer 140 is hardened by the light reflected by the second reflective layer 140. The width of the first reflective layer 230 may be formed to be larger than that of the second reflective layer 140, and the light reflected by the second reflective layer 140 is thus irradiated back to the second reflective layer 140 by the first reflective layer 230 so that light reflection is performed between the second reflective layer 140 and the first reflective layer 230. Thus, the resin layer 300 corresponding to the peripheral area 120 of the display panel 102 disposed between the second reflective layer 140 and the first reflective layer 230 is fully hardened by the light reflected between the second reflective layer 140 and the first reflective layer 230. The hardening of the resin layer 300 disposed between the second reflective layer 140 and the first reflective layer 230 is described below.

The hardening of the resin layer 300 will now be described in further detail with reference to FIG. 6.

Figure 6:
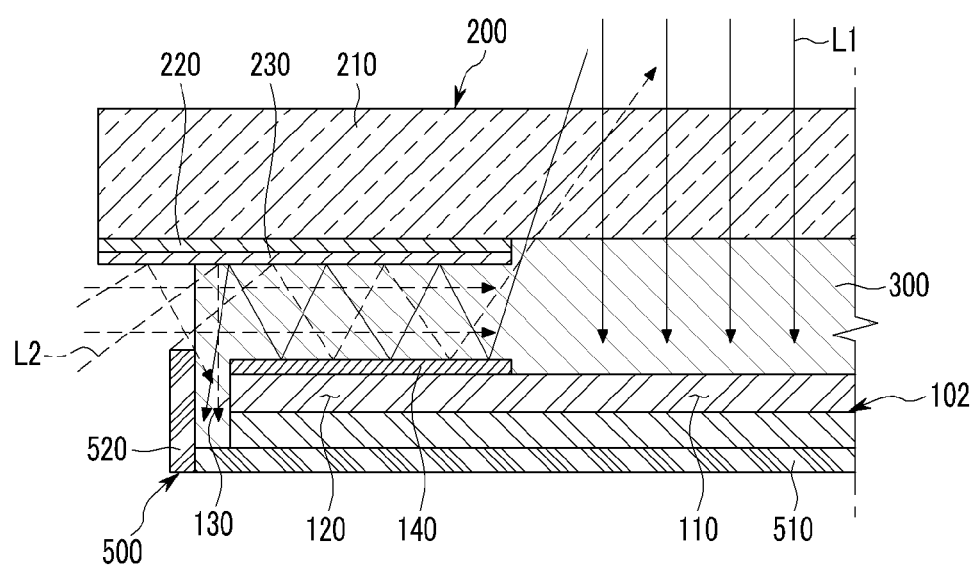
FIG. 6 is a cross-sectional view of a path of light for hardening a resin layer of the embodiment of a display device of FIG. 5.

FIG. 6 is a cross-sectional view of a path of light for hardening the resin layer of the embodiment of a display device of FIG. 5.

As shown in FIG. 6, in order to harden the resin layer 300 included in the display device 1001, an embodiment of the display device 1002 irradiates a first light L1, having a UV wavelength, through the transparent plate 200 of the display device 1001 to fully harden the resin layer 300 disposed between the transparent plate 200 and the display panel 102. In one embodiment, the resin layer 300 corresponding to the display area 110 of the display panel 102 is fully hardened by the first light L1 passed through the transparent plate 200, and the resin layer 300 corresponding to the peripheral area 120 of the display panel is fully hardened by the first light L1 reflected between the second reflective layer 140 and the first reflective layer 230. In addition, the first light L1 reflected between the second reflective layer 140 and the first reflective layer 230 is reflected back between the edge 130 of the display panel 102 and the barrier rib (or sidewall) 520 of the receiving member 500, by the first reflective layer 230 corresponding the edge 130 of the display panel 102 and the barrier rib 520 of the receiving member 500. Accordingly, the resin layer 300 disposed between the edge 130 of the display panel 102 and the barrier rib 520 of the receiving member 500 is fully hardened.

The first light L1 passed through the transparent plate 200 is reflected between the first reflective layer 230 and the second reflective layer 140 so that the resin layer 300 disposed between the display panel 102 and the transparent plate 200 is fully hardened. The first light L1 is reflected back to the first reflective layer 230 so that the resin layer 300 disposed between the edge 130 of the display panel 102 and the receiving member 500 is hardened, and all the resin layers 300 surrounding the display panel 102 are thus fully hardened.

When a second light L2, having a UV wavelength, is irradiated between the display panel 102 and the transparent plate 200 from a side of the display device 1002, the second light L2 is directly irradiated between the display panel 102 and the transparent plate 200 and is also reflected by the first reflective layer 230 or the second reflective layer 140. The second light L2 is reflected between the first and second reflective layers 230 and 140 such that the resin layer 300 disposed between the display panel 102 and the transparent plate 200 is fully hardened. The resin layer 300 disposed between the edge 130 of the display panel 102 and the barrier rib (or sidewall) 520 of the receiving member 500 is fully hardened by the second light L2 reflected by the first reflective layer 230 corresponding between the edge 130 of the display panel 102 and the barrier rib 520 of the receiving member 500 and then irradiated between the edge 130 of the display panel 102 and the barrier rib 520 of the receiving member 500.

The second light L2 irradiated between the display panel 102 and the transparent plate 200 is reflected between the first reflective layer 230 and the second reflective layer 140 so that the resin layer 300 disposed between the display panel 102 and the transparent plate 200 is fully hardened. The second light L2 is reflected back to the first reflectively layer 230 so that the resin layer 300 disposed between the edge 130 of the display panel 102 and the barrier rib (or sidewall) 520 of the receiving member 500 is fully hardened such that all the resin layers 300 surrounding the display panel 102 are fully hardened.

An embodiment of the display device 1002 fully hardens all the resin layers 300 surrounding the display panel 102 using at least one of the first and second lights L1 and L2, and all the resin layers 300 can be fully hardened more promptly when using the first and second lights L1 and L2 both.

With the resin layers 300 surrounding the display panel 102 fully hardened, the adhesiveness of the transparent plate 200 to the display panel 102 is enhanced and, the adhesiveness of the display panel 102 to the receiving member 500 is also enhanced. Accordingly, the impact resistance of the display device 1002 is enhanced.

Since all the resin layers 300 surrounding the display panel 102 are hardened in the display device 1002, image distortion that occurs due to stains or spots that may be generated in a resin layer that is not fully hardened may be prevented.

Since the resin layer 300 surrounds the display panel 102 in the display device 1002, generation of air gaps between the display panel 102 and the transparent plate 200 and between the display panel 102 and the receiving member 500 may be prevented. Insertion of foreign particles between the display panel 102 and the transparent plate 200 and between the display panel 102 and the receiving member 500 may also be prevented. Therefore, distortion of the image displayed on the display panel 102 due to the air gap or foreign particles may be prevented.

In some embodiments, the first and second reflective layers 230 and 140 have a plane shape. In some embodiments, at least a part of each of the first and second reflective layers 230 and 240 may be formed in a curved shape or with protrusions and depressions, in order to set a path of light reflected by the first and second reflective layers 230 and 140.

While this disclosure has been described in connection with what certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel including a display area and a peripheral area surrounding the display area;
a transparent plate covering the display area and the peripheral area;
a resin layer disposed between the display panel and the transparent plate, and hardened by light, wherein the resin layer along the peripheral area is configured to be hardened by the light reflected by the first reflective layer; and
a first reflective layer provided between the transparent plate and the resin layer, along the peripheral area of the display panel.

2. The display device of claim 1, wherein the display panel further comprises a second reflective layer along the peripheral area, with the resin layer interposed between the first reflective layer and the second reflective layer.

3. The display device of claim 2, wherein the resin layer along the peripheral area is configured to be hardened by the light reflected between the first reflective layer and the second reflective layer.

4. The display device of claim 3, wherein the transparent plate further comprises a black matrix layer covered by the first reflective layer.

5. The display device of claim 4, further comprising a receiving member receiving the display panel, wherein the receiving member comprises a bottom portion facing the display panel and a sidewall extending upward from the bottom portion and facing an edge of the display panel, and wherein the resin layer is disposed between the edge of the display panel and the sidewall.

6. The display device of claim 5, wherein the first reflective layer is wider than the second reflective layer, and the first reflective layer is disposed on the resin layer disposed between the edge of the display panel and the sidewall.

7. The display device of claim 6, wherein the resin layer disposed between the edge of the display panel and the sidewall is configured to be hardened by the light reflected by the first reflective layer.

8. The display device of claim 5, wherein the first reflective layer is configured to reflect light beams incident to the first reflective layer to an area between the sidewall and the edge of the display panel substantially filled with resin.

9. The display device of claim 1, wherein the display panel comprises liquid crystal or an organic light emitting element.

10. The display device of claim 9, wherein the light has a wavelength in the ultraviolet range.

11. A display device comprising:
a display panel including a display area and a peripheral area surrounding the display surface;
a transparent plate covering the display area and the peripheral area;
a resin layer disposed between the display panel and the transparent plate, and hardened by light;
a first reflective layer provided between the transparent plate and the resin layer, along the peripheral area of the display panel;
a second reflective layer along the peripheral area of the display panel, with the resin layer interposed between the first reflective layer and the second reflective layer,
wherein the resin layer along the peripheral area is configured to be hardened by the light reflected between the first reflective layer and the second reflective layer.

12. The display device of claim 11, wherein the transparent plate further comprises a black matrix layer covered by the first reflective layer.

13. The display device of claim 12, further comprising a receiving member receiving the display panel, wherein the receiving member comprises a bottom portion facing the display panel and a sidewall extending upward from the bottom portion and facing an edge of the display panel, and wherein the resin layer is disposed between the edge of the display panel and the sidewall.

14. The display device of claim 13, wherein the first reflective layer is wider than the second reflective layer, and the first reflective layer is disposed on the resin layer disposed between the edge of the display panel and the sidewall.

15. The display device of claim 14, wherein the resin layer disposed between the edge of the display panel and the sidewall is configured to be hardened by the light reflected by the first reflective layer.

16. The display device of claim 11, wherein the display panel comprises liquid crystal or an organic light emitting element.

17. The display device of claim 16, wherein the light has a wavelength in the ultraviolet range.

18. The display device of claim 11, wherein the first reflective layer and the second reflective layer are configured to reflect light beams incident to the first reflective layer and the second reflective layer to an area between the sidewall and the edge of the display panel substantially filled with resin.

* * * * *